United States Patent
Jung

(10) Patent No.: US 7,388,412 B2
(45) Date of Patent: Jun. 17, 2008

(54) CLOCK MULTIPLIERS USING FILTER BIAS OF A PHASE-LOCKED LOOP AND METHODS OF MULTIPLYING A CLOCK

(75) Inventor: Seok-Min Jung, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 123 days.

(21) Appl. No.: 11/503,803

(22) Filed: Aug. 14, 2006

(65) Prior Publication Data

US 2007/0040594 A1    Feb. 22, 2007

(30) Foreign Application Priority Data

Aug. 16, 2005    (KR)    ...................... 10-2005-0074967

(51) Int. Cl.
*H03B 19/00* (2006.01)
*H03L 7/06* (2006.01)
*H03H 11/26* (2006.01)

(52) U.S. Cl. .................. 327/116; 327/156; 327/119; 327/236; 327/158; 327/161; 327/261

(58) Field of Classification Search ................ 327/116, 327/119, 156, 158, 161, 236
See application file for complete search history.

(56) References Cited

U.S. PATENT DOCUMENTS 6,677,791 B2 *  1/2004  Okuda et al. ............... 327/158

2005/0285643 A1 * 12/2005 Lee ........................... 327/158
2007/0182470 A1 *  8/2007 Heyne ....................... 327/158

FOREIGN PATENT DOCUMENTS

| JP | 09-270680 | 10/1997 |
| JP | 2000-357951 | 12/2000 |
| KR | 100253181 | 1/2000 |

OTHER PUBLICATIONS

Combes, Michel, et al., "A Portable Clock Multiplier Generator Using Digital CMOS Standard Cells," IEEE Journal of Solid-State Circuits, vol. 31, No. 7, Jul. 1996, pp. 958-965.

* cited by examiner

*Primary Examiner*—Quan Tra
*Assistant Examiner*—Colleen O'Toole
(74) *Attorney, Agent, or Firm*—Mills & Onello LLP

(57) ABSTRACT

A clock multiplier includes a phase-locked loop (PLL), a bias generator, a counter, a selection circuit, a flip-flop, a phase comparator, a delay controller and a variable delay circuit. The variable delay circuit, which is biased by a delay cell bias signal, delays a reference signal by a first delay time and by a second time that is longer than the first delay time, and generates a first feedback signal corresponding to the first delay time, and a second feedback signal corresponding to the second delay time. Therefore, a clock multiplier may reduce the size of a delay cell and may be designed to be insensitive to changes in environmental conditions, such as a process, a voltage, a temperature, and so on.

18 Claims, 8 Drawing Sheets

700

CLOCK MULTIPLIERS USING FILTER BIAS OF A PHASE-LOCKED LOOP AND METHODS OF MULTIPLYING A CLOCK

CROSS-REFERENCE TO RELATED APPLICATIONS

This application claims priority under 35 U.S.C. § 119 to Korean Patent Application No. 10-2005-0074967 filed on Aug. 16, 2005 in the Korean Intellectual Property Office (KIPO), the entire contents of which are hereby incorporated by reference.

BACKGROUND OF THE INVENTION

1. Field of the Invention

The present invention relates to clock multipliers, and more particularly to clock multipliers using a filter bias of a phase-locked loop to reduce the size of a delay cell, and methods of multiplying a clock.

2. Description of the Related Art

The present invention relates generally to clock multipliers, and more specifically to clock multipliers that may be useful in a design of a low-power voltage circuit.

A clock multiplier multiplies a frequency of an input clock to generate an output clock having a frequency higher than that of an input clock, and then provides the output clock of the clock multiplier to one or more inner circuits of a semiconductor device.

One example embodiment of a clock multiplier using digital complementary metal-oxide semiconductor (CMOS) standard cells is proposed by Michel Combes et, al. in the paper, "A portable clock multiplier generator using digital CMOS standard cells," IEEE Journal of Solid-State Circuits, Vol. 31, No. 7, July 1996.

From an aspect of very large-scale integration (VLSI) designs, as operating frequencies in semiconductor devices have been increasing, it has become an important issue to design a clock generator that is insensitive to changes in environmental conditions.

SUMMARY OF THE INVENTION

Accordingly, the present invention is provided to substantially obviate one or more problems due to limitations and disadvantages of the related art.

Embodiments of the present invention provide a clock multiplier capable of multiplying an input clock, to generate a higher frequency by using a filter bias of a phase-locked loop (PLL), thereby reducing the size of a delay cell.

Embodiments of the present invention also provide a method of multiplying a clock capable of multiplying an input clock, to generate a higher frequency by using a filter bias of a PLL, thereby reducing the size of a delay cell.

According to one aspect, the invention is directed to a clock multiplier which includes a PLL, a bias generator, a counter, a selection circuit, a flip-flop, a phase comparator, a delay controller and a variable delay circuit. The PLL generates a phase-locked clock signal and an oscillated control voltage in response to an input clock signal. The bias generator generates at least one delay cell bias signal in response to the oscillated control voltage. The counter performs a count operation in response to a first feedback signal to generate an input selection signal. The selection circuit chooses one of the input clock signal and a second feedback signal in response to the input selection signal to output the chosen signal as a set signal. The flip-flop generates a delay reference signal in response to the set signal and the first feedback signal. The phase comparator compares the input clock signal with the second feedback signal to generate an error signal. The delay controller generates a delay selection signal for controlling an amount of a delay time based on the error signal. The variable delay circuit, which is biased by the delay cell bias signal, delays the delay reference signal by a first delay time and by a second delay time that is longer than the first delay time, and generates the first feedback signal corresponding to the first delay time and the second feedback signal corresponding to the second delay time, in response to the delay selection signal.

In one embodiment, the selection circuit comprises a multiplexer.

The variable delay circuit can include: a first delay circuit configured to delay the delay reference signal by the first delay time, and configured to generate first cell output signals and a first delay output signal, the first delay circuit being biased by the delay cell bias signal; a second delay circuit configured to delay the first delay signal by the second delay time, and configured to generate second delay output signals, the second delay circuit being biased by the delay cell bias signal; a first selection circuit configured to generate the first feedback signal corresponding to the first delay time in response to the delay selection signal; and a second selection circuit configured to generate the second feedback signal corresponding to the second delay time in response to the delay selection signal. The first and second selection circuits can include a multiplexer. The first delay output signal can correspond to the first cell output signal having the longest delay time among the first cell output signals. The oscillated control voltage can be insensitive to changes in environmental conditions, the environmental conditions including a process, a voltage and a temperature. The delay cell bias signal can include a first delay cell bias signal for biasing a P-type metal-oxide semiconductor (PMOS) transistor and a second delay cell bias signal for biasing a N-type MOS (NMOS) transistor. The bias generator can include: a first NMOS transistor having a gate to which the oscillated control voltage is applied and a source coupled to a first power voltage; a second NMOS transistor having a source coupled to the first power voltage, a drain from which the second delay cell bias signal is outputted, and a gate coupled to the drain of the second NMOS transistor; a first PMOS transistor having a source coupled to a second power voltage, and a drain and a gate commonly coupled to the drain of the first NMOS transistor; and a second PMOS transistor having a source coupled to a second power voltage, a drain coupled to the drain of the second NMOS transistor, and a gate coupled to the gate of the first PMOS transistor, the first delay cell bias signal being outputted from the gate of the second PMOS transistor. The first variable delay circuit can include: a plurality of delay cells coupled in a cascade configuration to each other, and configured to delay the delay reference signal by a unit time to generate the first cell output signals; a plurality of pull-up transistors configured to electrically connect the delay cells with a first power voltage in response to the first delay cell bias signal; a plurality of pull-down transistors configured to electrically connect the delay cells with a second power voltage in response to the second delay cell bias signal. Each of a plurality of the delay cells can include an inverter configured to invert the delay reference signal.

In one embodiment, the second variable delay circuit comprises: a plurality of delay cells connected in a cascade configuration to each other, and configured to delay the first delay output signal by a unit time to generate the second cell output signal; a plurality of pull-up transistors configured to electrically connect the delay cells with a first power voltage in response to the first delay cell bias signal; a plurality of pull-down transistors configured to electrically connect the delay cells with a second power voltage in response to the second delay cell bias signal. Each of the delay cells can include an inverter configured to invert the first delay output signal.

In one embodiment, the phase comparator comprises a RS flip-flop configured to output the error signal that is set in response to the second feedback signal and is reset in response to the input clock signal.

In one embodiment, the delay controller generates the selection signal by using a finite state machine to control the first delay time and the second delay time.

In one embodiment, a multiplying factor of the clock multiplier is determined based on the input selection signal.

In one embodiment, the clock multiplier further comprises a buffer configured to buffer the delay reference signal to generate an output clock signal.

According to another aspect, the present invention is directed to a variable delay circuit which includes a first variable delay circuit, a second variable delay circuit, a first selection circuit and a second selection circuit. The first variable delay circuit delays a delay reference signal by a first delay time, and generates first cell output signals and a first delay output signal. The first variable delay circuit is biased by at least one delay cell bias signal. The second variable delay circuit delays the first delay output signal by a second delay time, and generates second cell output signals. The second variable delay circuit is biased by the delay cell bias signal. The first selection circuit generates a first feedback signal corresponding to the first delay time in response to a delay selection signal. The second selection circuit generates a second feedback signal corresponding to the second delay time in response to the delay selection signal.

According to another aspect, the present invention is directed to a method of multiplying a clock which includes generating a phase-locked clock signal and an oscillated control voltage in response to an input clock signal; generating at least one delay cell bias signal in response to the oscillated control voltage; performing a counting operation in response to a first feedback signal to generate an input selection signal; choosing one of the input clock signal and a second feedback signal in response to the input selection signal to output the chosen signal as a set signal; generating a delay reference signal in response to the set signal and the first feedback signal; comparing the input clock signal with the second feedback signal to generate an error signal; generating a delay selection signal in order to control an amount of a delay time in response to the error signal; and delaying the delay reference signal by a first delay time and by a second delay time to generate the first feedback signal corresponding to the first delay time and the second feedback signal corresponding to the second delay time in response to the delay selection signal, the second delay time being longer than the first delay time.

Therefore, the clock multiplier according to the present invention may multiply a clock stably and reduce the size of a delay cell. Furthermore, the clock multiplier may be applied to the low-power voltage circuit.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE EMBODIMENTS

Example embodiments of the present invention are disclosed herein.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.)

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
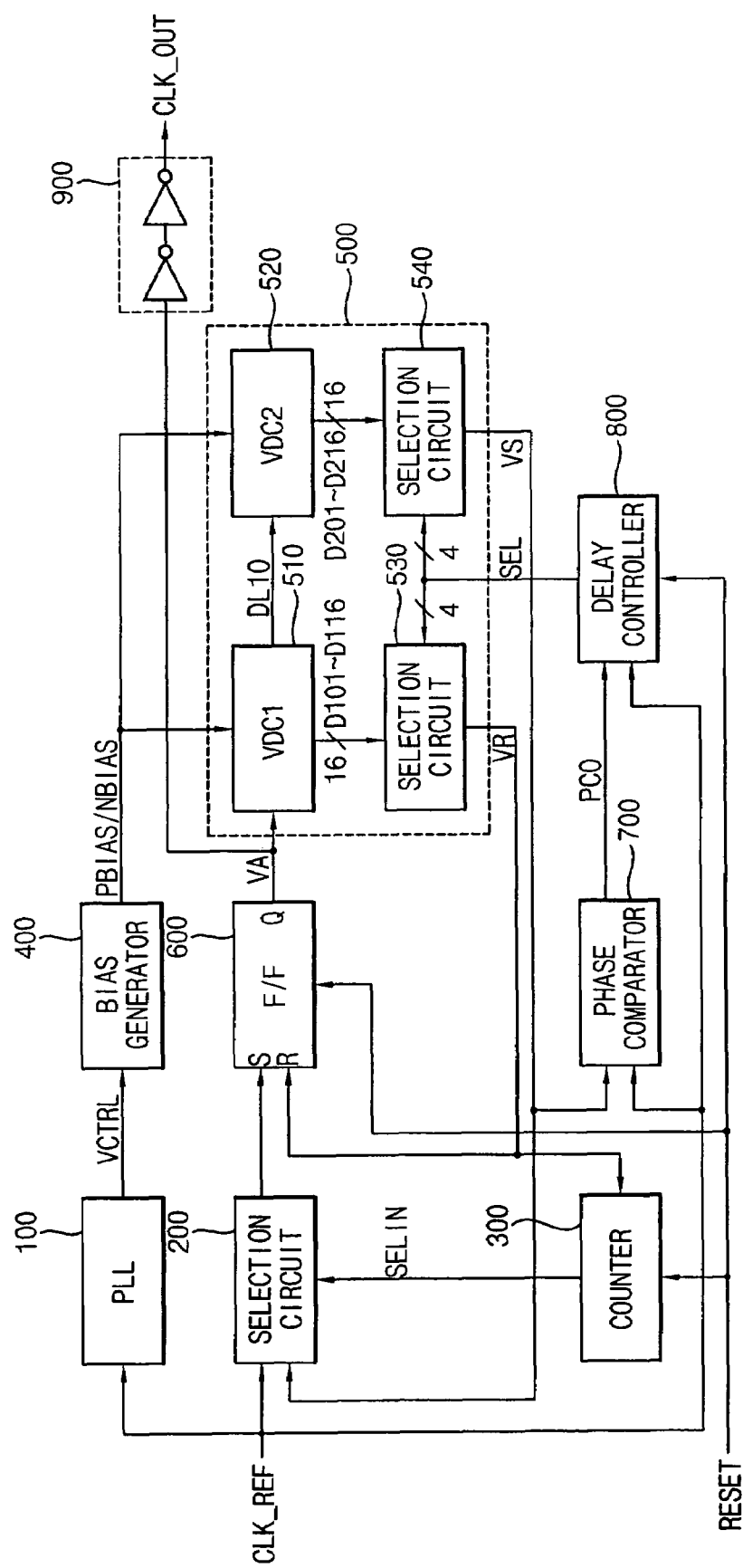
FIG. 1 is a block diagram illustrating a clock multiplier according to one example embodiment of the present invention.

FIG. 1 is a block diagram illustrating a clock multiplier according to one example embodiment of the present invention.

Referring to FIG. 1, the clock multiplier may include a phase-locked loop (PLL) 100, a bias generator 400, a counter 300, a selection circuit 200, a flip-flop 600, a phase comparator 700, a delay controller 800 and a variable delay circuit 500. The clock multiplier may further include a buffer 900 that buffers an output of the flip-flop 600 to generate an output clock signal CLK_OUT.

The PLL 100 generates a phase-locked clock signal and an oscillated control voltage VCTRL in response to an input clock signal CLK_REF and outputs the oscillated control voltage VCTRL. The bias generator 400 generates delayed cell bias signals PBIAS and NBIAS in response to the oscillated control voltage VCTRL. The counter 300 performs a count operation in response to a first feedback signal VR. In particular, the counter 300 counts a first feedback signal VR and generates an input selection signal SELIN.

The selection circuit 200 chooses one of the input clock signal CLK_REF and a second feedback signal VS to output the chosen signal as a set signal S. The selection circuit may be implemented with a multiplexer (MUX). The flip-flop 600 generates a delay reference signal VA having a high level or a low level in response to the set signal S and the first feedback signal VR.

The phase comparator 700 compares the input clock signal CLK_REF and the second feedback signal VS to generate an error signal PCO. The delay controller 800 receives the error signal PCO and the input clock signal CLK_REF, and generates a delay selection signal SEL in response to the error signal PCO. The delay selection signal SEL is used for controlling a delay time in the variable delay circuit 500. The delay controller 800 employs a finite state machine to determine an adequate delay path (for example, output pin) in the variable delay circuit 500. Thus, the delay time of the variable delay circuit 500 is determined based on the delay selection signal SEL.

The variable delay circuit 500 is biased by the delay cell bias signals PBIAS and NBIAS, and delays the delay reference signal VA by a first delay time and by a second delay time, which is longer than the first delay time. The variable delay circuit 500 generates the first feedback signal VR associated with the first delay time, and the second feedback signal VS associated with the second delay time in response to the delay selection signal SEL.

The variable delay circuit 500 includes a first variable delay circuit 510, a second variable delay circuit 520, a first selection circuit 530 and a second selection circuit 540.

The first variable delay circuit 510 is biased by the delay cell bias signals PBIAS and NBIAS, delays the delay reference signal VA by the first delay time, and generates first cell output signals D101 through D116 and a first delay output signal DL10. The first delay output signal DL10 may be the delay signal D116 having the longest delay time among the first cell output signals D101 through D116.

The second variable delay circuit 520, which is biased by the delay cell bias signals PBIAS and NBIAS, delays the first delay output signal DL10 by the second delay time, and generates second cell output signals D201 through 216.

The first selection circuit 530 generates the first feedback signal VR associated with the first delay time in response to the delay selection signal. The second selection circuit 540 generates the second feedback signal VS associated with the second delay time in response to the delay selection signal SEL. The first and second selection circuits may be implemented with a multiplexer (MUX).

Hereinafter, the operation of the clock multiplier with reference to FIG. 1 is described.

The selection circuit 200 chooses one of the input clock signal CLK_REF and the second feedback signal VS to output the chosen signal as the set signal S. The selection circuit 200 repeatedly chooses the second feedback signal VS as the set signal S, and then chooses the input clock signal CLK_REF. A repetition number may be provided through the input selection signal SELIN. The input selection signal SELIN, which is generated based on a count value of the counter 300, determines the multiplying factor of the clock multiplier.

For example, the set signal S may be the second feedback signal VS when the input selection signal SELIN is a logic "1" and the set signal S may be the input clock signal when the input selection signal SELIN is a logic "0."

When a delay time of the first feedback signal VR is T, and a delay time of the second feedback signal VS is 2T, the delay reference signal VA transitions to a logic "low" in response to a rising edge of the first feedback signal VR, and transitions to a logic "high" in response to a rising edge of the second feedback signal VS.

The phase comparator 700 compares the input clock signal CLK_REF with the second feedback signal VS to generate an error signal PCO. The delay controller 800 receives the error signal PCO and the input clock signal CLK_REF, and generates a delay selection signal SEL in response to the error signal PCO. The delay selection signal SEL determines an amount of a delay time of the first variable delay circuit 510 and the second variable delay circuit 520. The delay selection signal SEL may be a 4-bit signal, and is applied to the selection circuits 530 and 540.

The first selection circuit 530 chooses one of the first cell output signals D101 through D116 in response to the delay selection signal SEL, and outputs the chosen first cell output signal as the first feedback signal VR. The second selection circuit 540 chooses one of the second cell output signals D201 through D216 in response to the delay selection signal SEL, and outputs the chosen second cell output signals as the second feedback signal VR. The amount of a delay time is controlled by the cell output signals chosen by the first and second selection circuits 530 and 540.

When the error signal PCO is a logic "low" at a rising edge of the input clock signal CLK_REF, the delay controller 800 increases a value of the delay selection signal SEL and the first selection circuit 530 chooses one of the first cell output signals D101 through D116, such that the delay time of the chosen first cell output signal is longer than that of the first cell output signal outputted during the a previous cycle. For example, when the delay selection signal SEL is '0001' and the first cell output signal D102 is chosen during the previous cycle among the first cell output signals D101 through D116, the delay selection signal SEL may be changed to '0010' and thus the first cell output signal D102 may be chosen among the first cell output signals D101 through D116.

Similarly, when the error signal PCO at a rising edge of the input clock signal CLK_REF is a logic "low," the second selection circuit 540 chooses one of the second cell output signals D201 through D216, such that the delay time of the chosen second cell output signal is longer than that of the second cell output signal outputted during the previous cycle. For example, when the delay selection signal SEL is 0001 and the second cell output signal D201 is chosen during the previous cycle among the second cell output signals D201 through D216, the delay selection signal SEL may be changed to 0010 and thus the second cell output signal D202 may be chosen among the second cell output signals D201 through D216.

The clock multiplier in FIG. 1 uses an oscillated control voltage VCTRL generated by the PLL 100 as a bias voltage of the first variable delay circuit 510 and the second variable delay circuit 510. The oscillated control voltage VCTRL is transformed into the delay cell bias signals PBIAS and NBIAS by the bias generator 400 to be provided to the first variable delay circuit 510 and the second variable delay circuit 520.

The oscillated control voltage VCTRL and a delay time of the delay cell is designed to be insensitive to changes in environmental conditions, such as a process, a voltage, a temperature, and so on. Thus, the clock multiplier in FIG. 1 may reduce the number of delay taps, that is, delay cell units.

Figure 2:
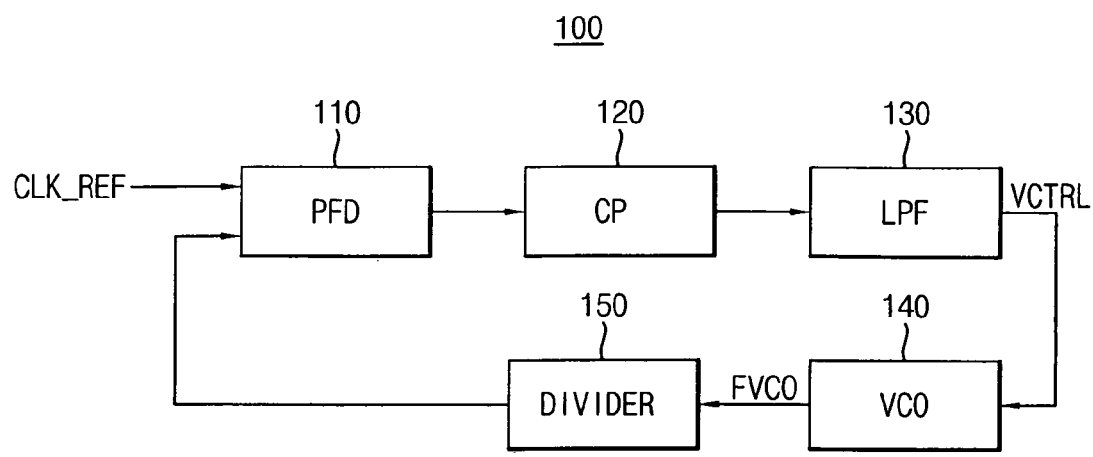
FIG. 2 is a block diagram illustrating a phase-locked loop (PLL) of the clock multiplier in FIG. 1.

FIG. 2 is a block diagram illustrating a PLL of the clock multiplier in FIG. 1.

Referring to FIG. 2, a PLL 100 includes a phase/frequency detector (PFD) 110, a charge pump 120, a loop filter 130, a voltage controlled oscillator (VCO) 140 and a divider 150.

The PFD 110 generates an up-signal or a down-signal based on a phase difference and a frequency difference between an input clock signal CLK_REF and a feedback signal. The charge pump 120 outputs a current signal that has a different level depending upon the up-signal or the down-signal generated by PFD 110. The loop filter 130 integrates (for example, by performing a low pass filtering) the current outputted from the charge pump 120 and generates an oscillated control voltage VCTRL.

The VCO 140 generates an oscillating signal FVCO of which a frequency varies in response to a direct current (DC) level of the oscillated control voltage VCTRL. The divider 150 generates a feedback signal based on the FVCO signal of the VCO 140 to provide the feedback signal to the PFD 110. When the PLL is locked, the input clock signal CLF_REF and the feedback signal have substantially the same phase and frequency.

Figure 3:
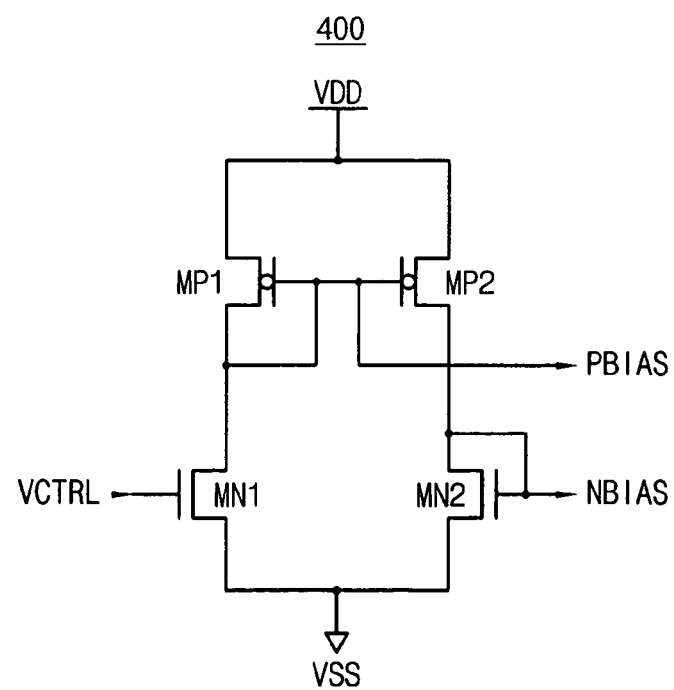
FIG. 3 is a circuit diagram illustrating a bias generator of the clock multiplier in FIG. 1.

FIG. 3 is a circuit diagram illustrating a bias generator of the clock multiplier in FIG. 1.

Referring to FIG. 3, a bias generator 400 includes P-type MOS (PMOS) transistors MP1 and MP2, and N-type MOS (NMOS) transistors MN1 and MN2.

The NMOS transistor MN1 has a gate to which the oscillated control voltage VCTRL is applied, and a source connected with a second power supply voltage VSS. The NMOS transistor MN2 has a source connected with the second supply power voltage VSS, a drain from which a delay cell bias signal NBIAS is outputted, and a gate connected with the drain of the NMOS transistor MN2.

The PMOS transistor MP1 has a source connected with a first power voltage VDD, and a drain commonly connected with the drain of the NMOS transistor MN1. The PMOS transistor MP1 has a gate commonly coupled with the drain thereof. The PMOS transistor MP2 has a source connected with the first power voltage VDD, a drain connected with the drain of the NMOS transistor MN2, and a gate connected with a gate of the PMOS transistor MP1. A delay cell bias signal PBIAS is outputted from the PMOS transistor MP2.

The bias generator 400 in FIG. 3 generates the delay cell bias signals PBIAS and NBIAS in response to the oscillated control voltage VCTRL. The generated delay cell bias signals PBIAS and NBIAS are provided to the first variable delay circuit 510 and the second variable delay circuit 520.

Figure 4:
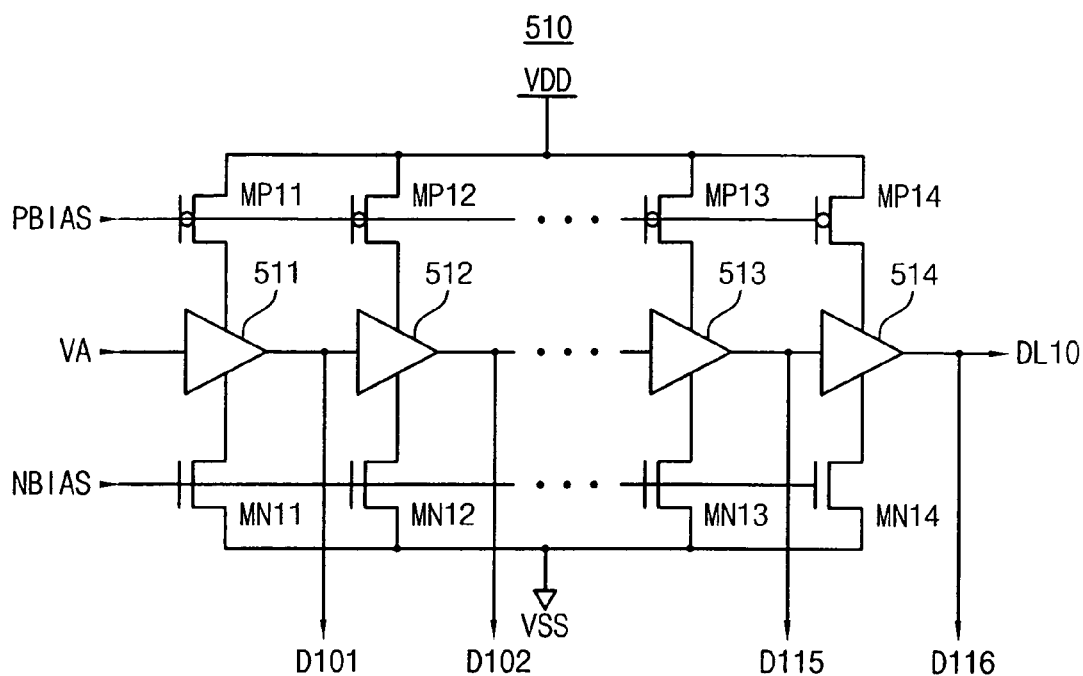
FIG. 4 is a circuit diagram illustrating a first variable delay circuit of the clock multiplier in FIG. 1.

FIG. 4 is a circuit diagram illustrating a first variable delay circuit of the clock multiplier in FIG. 1.

Referring to FIG. 4, a first delay circuit 510 includes delay cells 511 through 514, PMOS transistors MP11 through MP14, and NMOS transistors MN11 through MN14.

The delay cells 511 through 514, which are connected in a cascade configuration to each other, delay a delay reference signal VA by a unit time to generate first cell output signals D101 through D106. The PMOS transistors MP11 through MP14 electrically connect the delay cells 511 through 514 with a power voltage VDD, respectively, in response to a first delay cell bias signal PBIAS. The NMOS transistors MN11 through MN14 electrically connect the delay cells 511 through 514 with a ground voltage VSS in response to a second delay cell bias NBIAS.

Figure 5:
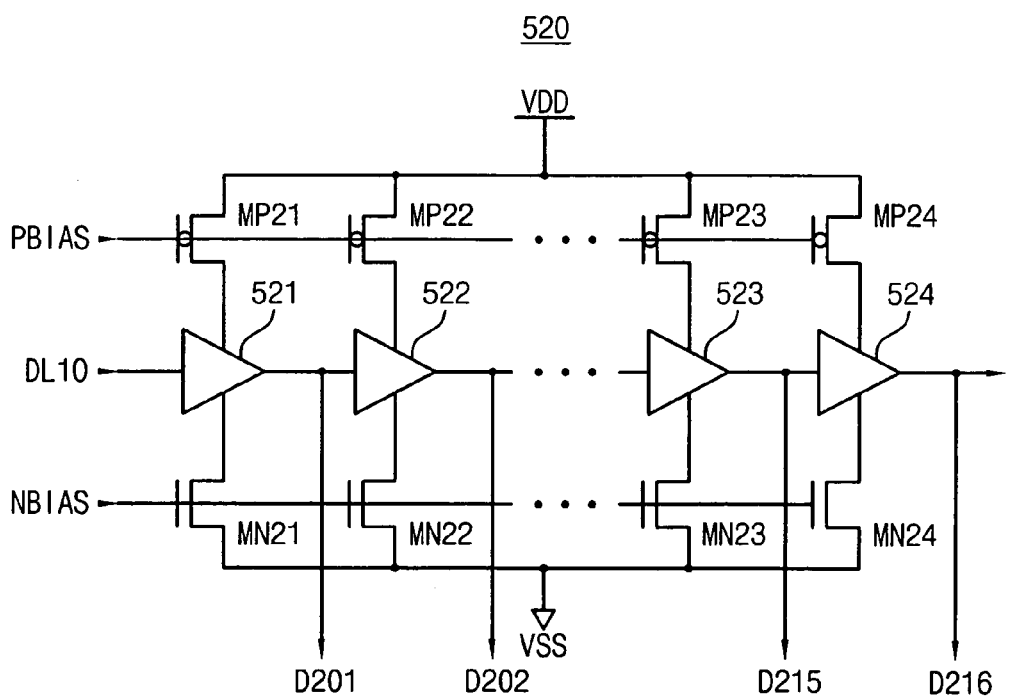
FIG. 5 is a circuit diagram illustrating a second variable delay circuit of the clock multiplier in FIG. 1.

FIG. 5 is a circuit diagram illustrating a second variable delay circuit of the clock multiplier in FIG. 1. A configuration of the second variable delay circuit is similar to that of the first variable delay circuit in FIG. 4; however, an input signal is not the delay reference signal VA but the first delay output signal DL10 that is outputted from the first variable delay circuit.

Referring to FIG. 5, a second variable delay circuit 520 includes delay cells 521 through 524, PMOS transistors MP21 through MP24, and NMOS transistors MN21 through MN24.

The delay cells 521 through 524, which are connected in a cascade configuration to each other, delay the first delay output signal by a unit time to generate second cell output signals D201 through D216. The PMOS transistors MP21 through MP24 electrically connect the delay cells 521 through 524 with a power voltage VDD, respectively, in response to a first delay cell bias PBIAS. The NMOS transistors MN21 through MN24 electrically connect the delay cells 521 through 524 with a ground voltage VSS, respectively, in response to a second delay cell bias NBIAS.

Figure 6:
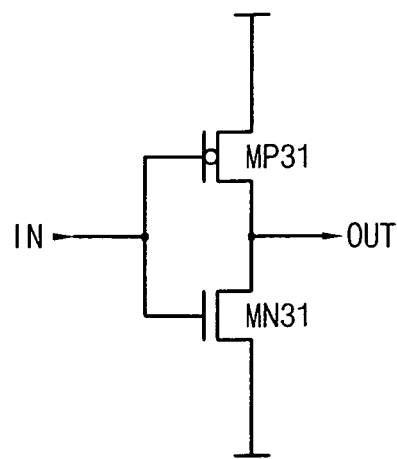
FIG. 6 is a circuit diagram illustrating a delay cell of the variable delay circuits in FIGS. 4 and 5.

FIG. 6 is a circuit diagram illustrating a delay cell of the variable delay circuits in FIG. 4 and FIG. 5.

Referring to FIG. 6, the delay cell includes a PMOS transistor MP31 and an NMOS transistor MN31. An output voltage signal OUT is an inverted voltage signal of an input voltage signal IN.

Hereinafter, the operation of the variable delay circuit 500 is described with reference to FIGS. 4, 5 and 6.

The first and second variable delay circuits 510 and 520 generate a bias current in response to a first delay cell bias signal PBIAS and a second delay cell bias signal NBIAS that are generated in response to the oscillated control voltage VCTRL.

Sixteen taps of the first variable delay circuit 510 generate the sixteen first output signals D101 through D116, respectively, and sixteen taps of the second variable delay circuit 520 generate the sixteen second output signals D201 through D216, respectively. Each of the delay cells 511 through 514 delays the delay reference signal VA by a predetermined time, respectively, and each of the delay cells 521 through 524 delays the first delay output signal DL10 by a predetermined time.

Figure 7:
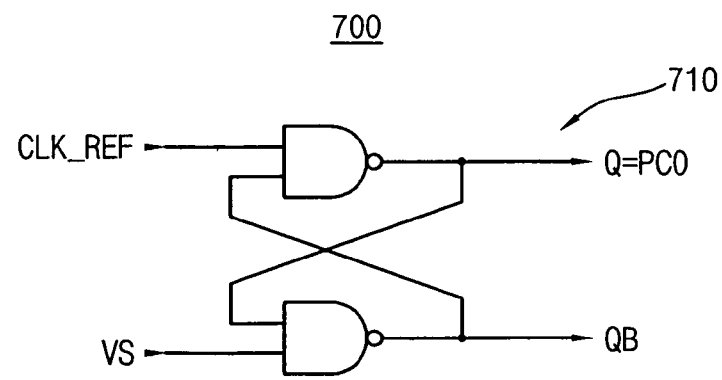
FIG. 7 is a circuit diagram illustrating a phase comparator of the clock multiplier in FIG. 1.

FIG. 7 is a circuit diagram illustrating a phase comparator circuit of the clock multiplier in FIG. 1.

Referring to FIG. 7, a phase comparator 700 includes a type of reset-set (RS) flip-flop and compares an input clock signal CLK_REF with a second feedback signal VS. With reference to a truth table in FIG. 7, an output Q (i.e., PCO) transitions into a logic '0' when the input clock signal CLK_REF is a logic '1' and the second feedback signal VS is a logic '0', and an output Q (i.e., PCO) transitions into a logic '1' when the input clock signal CLK_REF is a logic '0' and the second feedback signal VS is a logic '1'.

Figure 8:
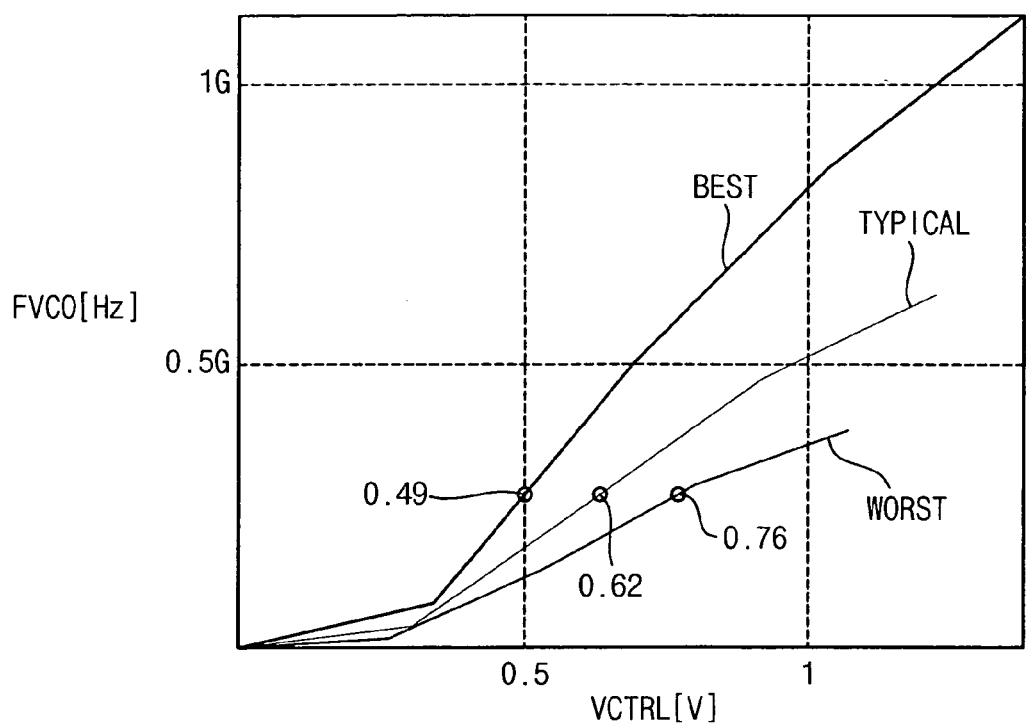
FIG. 8 is a simulation graph illustrating a voltage-frequency curve of the voltage-controlled oscillator included in the PLL of FIG. 2.

FIG. 8 is a simulation graph illustrating a voltage-frequency curve of the voltage-controlled oscillator included in the PLL of FIG. 2.

Referring to FIG. 8 illustrating three different results depending on processes of manufacturing semiconductor devices, a WORST curve represents a case where the manufacturing process is slow, a BEST curve represents a case where the manufacturing process is fast, and a TYPICAL curve represents a case where the manufacturing process is normal.

As illustrated in FIG. 8, the voltage controlled oscillator (VCO) 140 of FIG. 2 generates the oscillating signal FVCO having substantially the same frequency at the oscillated control voltages VCTRL of about 0.76V, about 0.62V and about 0.49V, respectively, according to the different process conditions of the WORST, TYPICAL and BEST cases. The variation of the oscillated control voltages VCTRL depending on the process condition is not significant. Therefore, when the oscillated control voltage VCTRL generated by the PLL is used as a bias of a variable delay circuit, a delay time of the variable delay circuit may be insensitive to changes in environmental conditions, such as a process, a voltage, a temperature, and so on.

Figure 9A:
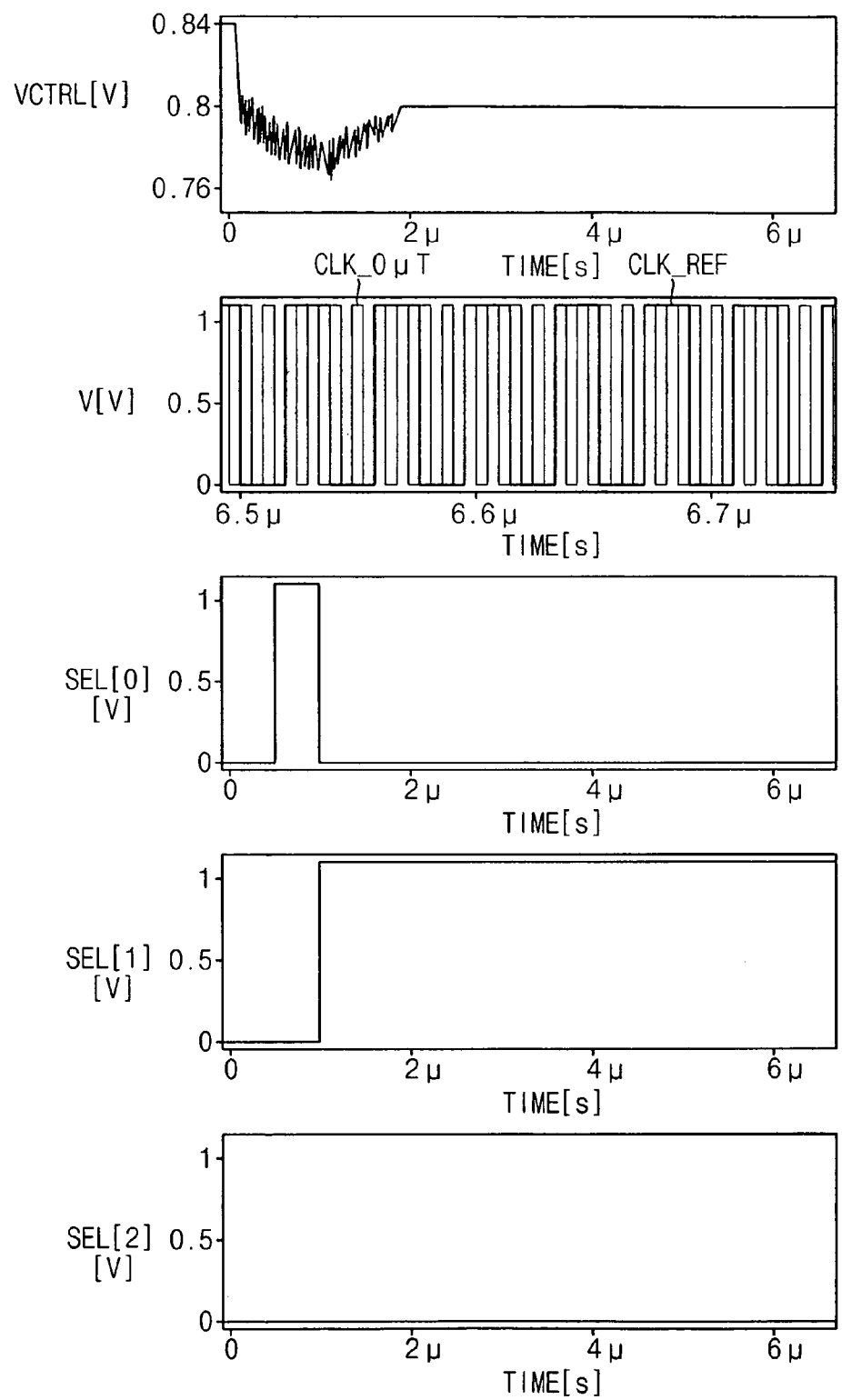
FIG. 9A is a simulation graph illustrating simulation results of the clock multiplier in FIG. 1 in a WORST case.
Figure 9B:
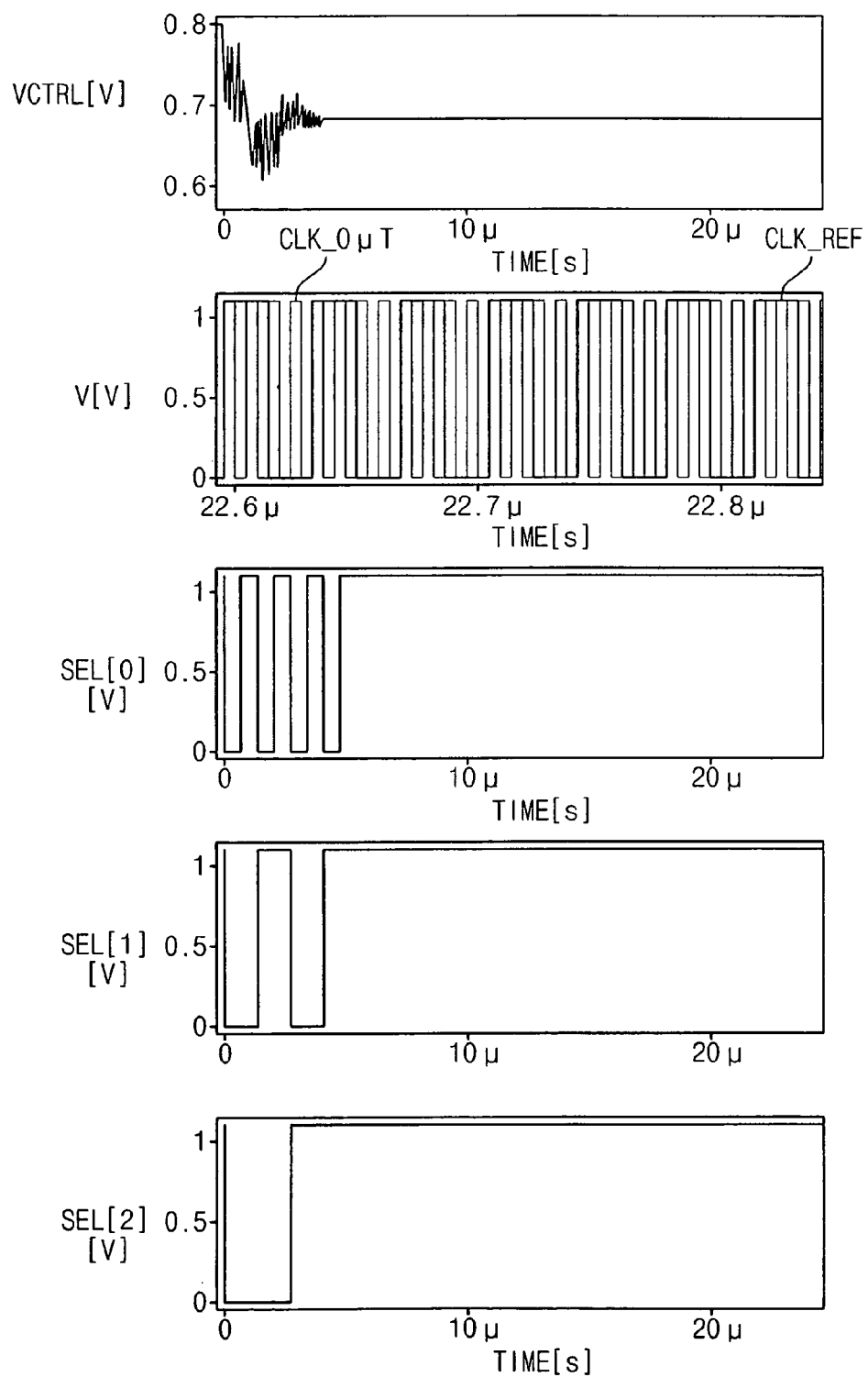
FIG. 9B is a simulation graph illustrating simulation results of the clock multiplier in FIG. 1 in a TYPICAL case.
Figure 9C:
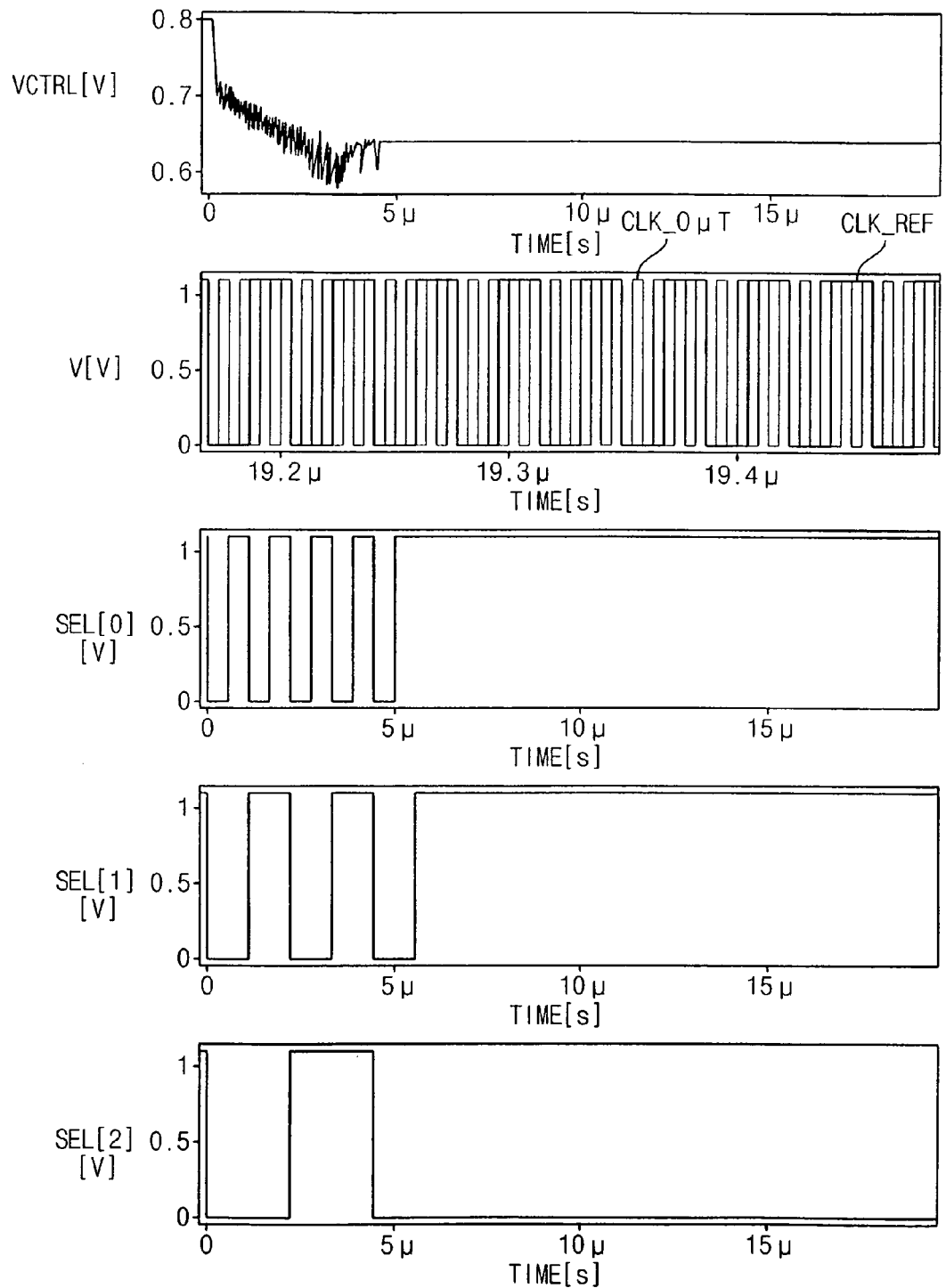
FIG. 9C is a simulation graph illustrating simulation results of the clock multiplier in FIG. 1 in a BEST case.

FIG. 9A is a simulation graph illustrating simulation results of the clock multiplier in FIG. 1 in a WORST case, FIG. 9B is a simulation graph illustrating simulation results of the clock multiplier in a TYPICAL case, and FIG. 9C is a simulation graph illustrating simulation results of the clock multiplier in a BEST case.

In FIGS. 9A, 9B and 9C, the waveforms of the oscillated control voltage VCTRL, the input clock signal CLK_REF and the output clock signal CLK_OUT are illustrated.

The input clock signal CLK_OUT and the output clock signal CLK_OUT are locked, and the output clock signal CLK_OUT of about 108 MHz is generated, respectively, when a 3-bit delay selection (SEL[0], SEL[1], SEL[2]) is '0010' in the WORST case, when a 3-bit delay selection (SEL[0], SEL[1], SEL[2]) is '0111' in the TYPICAL case, and when a 3-bit delay selection (SEL[0], SEL[1], SEL[2]) is '1011' in the BEST case.

As described above, the clock multiplier according to above example embodiments of the present invention may multiply a clock stably and reduce the size of a delay cell. In addition, the clock multiplier may be applied to the low-power voltage circuit.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A clock multiplier comprising:
   a phase-locked loop (PLL) configured to generate a phase-locked clock signal and an oscillated control voltage in response to an input clock signal;
   a bias generator configured to generate at least one delay cell bias signal in response to the oscillated control voltage;
   a counter configured to perform a count operation in response to a first feedback signal to generate an input selection signal;
   a selection circuit configured to choose one of the input clock signal and a second feedback signal in response to the input selection signal to output the chosen signal as a set signal;
   a flip-flop configured to generate a delay reference signal in response to the set signal and the first feedback signal;
   a phase comparator configured to compare the input clock signal with the second feedback signal to generate an error signal;
   a delay controller configured to generate a delay selection signal for controlling an amount of a delay time, based on the error signal; and
   a variable delay circuit configured to delay the delay reference signal by a first delay time and by a second delay time to generate the first feedback signal corresponding to the first delay time and the second feedback signal corresponding to the second delay time in response to the delay selection signal, the variable delay circuit being biased by a delay cell bias signal, the second delay time being longer than the first delay time.

2. The clock multiplier of claim 1, wherein the selection circuit comprises a multiplexer.

3. The clock multiplier of claim 1, wherein the variable delay circuit comprises:
   a first delay circuit configured to delay the delay reference signal by the first delay time, and configured to generate first cell output signals and a first delay output signal, the first delay circuit being biased by the delay cell bias signal;
   a second delay circuit configured to delay the first delay signal by the second delay time, and configured to generate second delay output signals, the second delay circuit being biased by the delay cell bias signal;
   a first selection circuit configured to generate the first feedback signal corresponding to the first delay time in response to the delay selection signal; and
   a second selection circuit configured to generate the second feedback signal corresponding to the second delay time in response to the delay selection signal.

4. The clock multiplier of claim 3, wherein the first and second selection circuits comprise a multiplexer.

5. The clock multiplier of claim 3, wherein the first delay output signal corresponds to the first cell output signal having the longest delay time among the first cell output signals.

6. The clock multiplier of claim 3, wherein the oscillated control voltage is insensitive to changes in environmental conditions, the environmental conditions including a process, a voltage and a temperature.

7. The clock multiplier of claim 5, wherein the delay cell bias signal includes a first delay cell bias signal for biasing a P-type metal-oxide semiconductor (PMOS) transistor and a second delay cell bias signal fro biasing a N-type MOS (NMOS) transistor.

8. The clock multiplier of claim 7, wherein the bias generator comprises:
a first NMOS transistor having a gate to which the oscillated control voltage is applied and a source coupled to a first power voltage;
a second NMOS transistor having a source coupled to the first power voltage, a drain from which the second delay cell bias signal is outputted, and a gate coupled to the drain of the second NMOS transistor;
a first PMOS transistor having a source coupled to a second power voltage, and a drain and a gate commonly coupled to the drain of the first NMOS transistor; and
a second PMOS transistor having a source coupled to a second power voltage, a drain coupled to the drain of the second NMOS transistor, and a gate coupled to the gate of the first PMOS transistor, the first delay cell bias signal being outputted from the gate of the second PMOS transistor.

9. The clock multiplier of claim 7, wherein the first variable delay circuit comprises:
a plurality of delay cells coupled in a cascade configuration to each other, and configured to delay the delay reference signal by a unit time to generate the first cell output signals;
a plurality of pull-up transistors configured to electrically connect the delay cells with a first power voltage in response to the first delay cell bias signal;
a plurality of pull-down transistors configured to electrically connect the delay cells with a second power voltage in response to the second delay cell bias signal.

10. The clock multiplier of claim 9, wherein each of a plurality of the delay cells comprises an inverter configured to invert the delay reference signal.

11. The clock multiplier of claim 7, wherein the second variable delay circuit comprises:
a plurality of delay cells connected in a cascade configuration to each other, and configured to delay the first delay output signal by a unit time to generate the second cell output signal;
a plurality of pull-up transistors configured to electrically connect the delay cells with a first power voltage in response to the first delay cell bias signal;
a plurality of pull-down transistors configured to electrically connect the delay cells with a second power voltage in response to the second delay cell bias signal.

12. The clock multiplier of claim 11, wherein each of the delay cells comprises an inverter configured to invert the first delay output signal.

13. The clock multiplier of claim 7, wherein the phase comparator comprises a RS flip-flop configured to output the error signal that is set in response to the second feedback signal and is reset in response to the input clock signal.

14. The clock multiplier of claim 7, wherein the delay controller generates the selection signal by using a finite state machine to control the first delay time and the second delay time.

15. The clock multiplier of claim 1, wherein a multiplying factor of the clock multiplier is determined based on the input selection signal.

16. The clock multiplier of claim 1, further comprising a buffer configured to buffer the delay reference signal to generate an output clock signal.

17. A variable delay circuit, comprising:
a first variable delay circuit configured to delay a delay reference signal by a first delay time, and configured to generate first cell output signals and a first delay output signal, the first variable delay circuit being biased by at least one delay cell bias signal;
a second variable delay circuit configured to delay the first delay output signal by a second delay time, and configured to generate second cell output signals, the second variable delay circuit being biased by the delay cell bias signal;
a first selection circuit configured to generate a first feedback signal corresponding to the first delay time in response to a delay selection signal; and
a second selection circuit configured to generate a second feedback signal corresponding to the second delay time in response to the delay selection signal.

18. A method of multiplying a clock, comprising:
generating a phase-locked clock signal and an oscillated control voltage in response to an input clock signal;
generating at least one delay cell bias signal in response to the oscillated control voltage;
performing a counting operation in response to a first feedback signal to generate an input selection signal;
choosing one of the input clock signal and a second feedback signal in response to the input selection signal to output the chosen signal as a set signal;
generating a delay reference signal in response to the set signal and the first feedback signal;
comparing the input clock signal with the second feedback signal to generate an error signal;
generating a delay selection signal in order to control an amount of a delay time in response to the error signal; and
delaying the delay reference signal by a first delay time and by a second delay time to generate the first feedback signal corresponding to the first delay time and the second feedback signal corresponding to the second delay time in response to the delay selection signal, the second delay time being longer than the first delay time.

* * * * *